United States Patent
Makwana (10) Patent No.: US 10,629,285 B2
(45) Date of Patent: Apr. 21, 2020

(54) VERIFICATION OF A BRIDGE HAVING A LATE WRITE BUFFER

(71) Applicant: NXP USA, INC., Austin, TX (US)

(72) Inventor: Prakashkumar Govindbhai Makwana, Austin, TX (US)

(73) Assignee: NXP USA, Inc., Austin, TX (US)

( * ) Notice: Subject to any disclaimer, the term of this patent is extended or adjusted under 35 U.S.C. 154(b) by 149 days.

(21) Appl. No.: 15/986,322

(22) Filed: May 22, 2018

(65) Prior Publication Data

US 2019/0362802 A1 Nov. 28, 2019

(51) Int. Cl.
  *G11C 29/00* (2006.01)
  *G11C 29/38* (2006.01)
  *G11C 29/36* (2006.01)

(52) U.S. Cl.
  CPC .............. *G11C 29/38* (2013.01); *G11C 29/36* (2013.01)

(58) Field of Classification Search
  None
  See application file for complete search history.

(56) References Cited

U.S. PATENT DOCUMENTS

| 5,941,970 | A | * | 8/1999 | Lange | ................. | G06F 13/4059 710/314 |
| 6,055,598 | A | * | 4/2000 | Lange | ................. | G06F 13/4059 710/100 |
| 6,202,101 | B1 | * | 3/2001 | Chin | ................. | G06F 13/1621 710/5 |
| 6,449,701 | B1 | * | 9/2002 | Cho | ................. | G06F 13/1673 710/39 |
| 2009/0307473 | A1 | * | 12/2009 | Miller | ................. | G06F 9/3824 712/245 |
| 2010/0318716 | A1 | * | 12/2010 | Nguyen | ................. | G06F 13/4027 710/314 |
| 2013/0042038 | A1 | * | 2/2013 | Byrne | ................. | G06F 13/362 710/113 |
| 2019/0220423 | A1 | * | 7/2019 | Makwana | ................. | G06F 13/1626 |

OTHER PUBLICATIONS

J. F. Silverio, Y. M. Ng and D. F. Anderson, "Hierarchical indexing data structure method for verifying the functionality of the STI-to-PCI bridge chips of the IBM eServer z900," in IBM Journal of Research and Development, vol. 46, No. 4.5, pp. 617-629, Jul. 2002.doi: 10.1147/rd.464.0617 (Year: 2002).*

(Continued)

*Primary Examiner* — Daniel F. McMahon (57) ABSTRACT

Verifying a device under test (DUT) in which the DUT includes a bridge with a late write buffer includes storing write requests provided to the bridge in an initiator queue, and storing write requests provided to the target memory in a target queue. Upon both the initiator and target queues being non-empty, when entry addresses of top entries of the initiator and target queue match, data entries of the top entries of the initiator and target queue do not match, and the initiator queue has more than one entry, determining whether an entry address of a next entry in the initiator queue matches the entry address of the top entry in the initiator queue, and when the entry addresses of the next entry and the top entry in the initiator queue match, merging the top and next entry of the initiator queue and deleting the top entry of initiator queue.

20 Claims, 4 Drawing Sheets

(56) References Cited

OTHER PUBLICATIONS

Cummings, Clifford E.; "OVM/UVM Scoreboards—Fundamental Architectures" Sunburst Design World Class Verilog, SystemVerilog & OVM/UVM Training; SNUG 2013 (Silicon Valley), Rev 1.1.
Francesconi, Juan, et al.; "UVM Based Testbench Architecture for Unit Verification" Argentine Conference on Micro-Nanoelectronics, Technology and Applications (EAMTA), Jul. 24-25, 2014; DOI: 10.1109/EAMTA.2014.6906085.

* cited by examiner

VERIFICATION OF A BRIDGE HAVING A LATE WRITE BUFFER

BACKGROUND

Field

This disclosure relates generally to data processing systems, and more specifically, to data verification in a data processing system having a bridge with a late write buffer.

Related Art

In data processing systems, a bridge is used between an initiator and a target to convert signals from one communication protocol at the initiator interface to another communication protocol at the target interface. For example, the initiator can be any master of the data processing system, and the target can be any peripheral, such as a memory, in which the bridge allows communication between the master and the peripheral. To improve efficiency of a bridge, late write buffers are commonly used to provide an early response on the initiator interface by storing write transactions in the late write buffer and posting the write on the target interface when the target interface is available. In this manner, write transactions can be completed on the initiator interface without waiting for its completion on the target side. Also, in the case of a memory on the target side, reads generally have more latency that writes, so, through the use of the late write buffer, a read which is posted on an initiator interface after a write can actually be issued on the target interface before the write. A late write buffer can also be used to merge read or write transactions. While all these uses of a late write buffer improve performance of a bridge, late write buffers result in an increase of scenarios needing verification as compared to bridges without a late write buffer. Therefore, a need exists for an improved way to verify data sanity of a bridge having a late write buffer.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As indicated above, the use of a bridge having late write buffer (LWB) results in increased performance but at the price of increased scenarios which need verification. In one embodiment, the bridge having the LWB is verified within a verification system in which the bridge is coupled between an initiator interface and a target interface, with the target interface coupled to a target responder with memory. The verification system uses an initiator model which models the bridge in combination with the target responder, a target model which models the target responder, and a transaction level memory model to verify the bridge with the LWB. In one aspect, data sanity of the bridge having a LWB is verified using the initiator model by checking end-to-end data correctness on the initiator interface on read transactions, irrespective of sequence and combination of transactions. In another aspect, after a plurality of transactions, a check between the data and addresses of the initiator and target models is performed to make sure that all initiator transactions occur on the target interface. In another aspect, an initiator queue and target queue are used in addition to the transaction level memory model to verify initiator transactions that cannot be matched one to one to target transactions due to the use of the LWB. Therefore, by using a combination of the above aspects in a verification system, improved data sanity verification of a bridge with a LWB can be achieved.

In a bridge having an LWB, write transactions received at the bridge from the initiator interface are placed in the LWB until the target is ready, at which point the write transaction is posted to the target interface. In the current embodiment, it is assumed that the LWB has a depth of one, and thus only has one entry to hold one write transaction. Alternate embodiments may have more entries. The LWB can also be used to allow longer latency read transactions to proceed first to the target or to allow for the merging of read or write transactions.

Below is a table which illustrates various examples of initiator transactions, and the possible target transactions depending on different time delays between initiator transactions. In the table below, each transaction is described using two letters followed by a number. The first letter is "I" or "T" which indicates whether the transaction is an initiator transaction or a target transaction, respectively. The second letter is a "W" or an "R" to indicate a write or a read transaction, respectively. The number at the end of the transaction indicates a corresponding address from which a read occurs or to which a write occurs. For example, a transaction "IW1" indicates an initiator write transaction to address location 1 and a transaction "TR3" indicates a target read from address location 3.

| Row Number | Initiator Transactions | Possible Target Transactions | Description |
|---|---|---|---|
| 1 | IW1, IR2, IW3 | TW1, TR2, TW3 | Normal 1 to 1 mapping between initiator and target transactions |
| 2 | | TR2, TW1, TW3 | TR2 issued ahead of TW1 on target interface as read has higher priority |
| 3 | IW1, IR2, IW1 | TW1, TR2, TW1 | Normal 1 to 1 mapping between initiator and target transactions |
| 4 | | TR2, TW1, TW1 | TR2 issued ahead of TW1 on target interface as read has higher priority |
| 5 | | TR2, TW1 | TR2 issued ahead, and 2 initiator writes at same address merged to single target write TW1 |

-continued

| Row Number | Initiator Transactions | Possible Target Transactions | Description |
|---|---|---|---|
| 6 | IW1, IR1, IW1 | TW1, TR1, TW1 | Normal 1 to 1 mapping between initiator and target transactions |
| 7 | | TW1, TW1 | Initiator read address hit in late write buffer, no read on target interface |
| 8 | | TW1 | Initiator read address hit in late write buffer, no read on target interface, and 2 writes merged to single target write TW1 |

Referring to rows 1 and 2 above, initiator transactions received from the initiator interface are IW1, IR2, and IW3, in that order. In row 1, it is assumed that there is a sufficient gap in time between the write transactions such that a write transaction is not present in the LWB when a next initiator transaction is received by the initiator interface. In this case, the target transactions are provided as TW1 (corresponding IW1), TR2 (corresponding to IR2), and TW3 (corresponding to IW3), in that order. Therefore, row 1 represents a normal (and unique) one-to-one mapping between initiator and target transactions. In row 2, however, it is assumed that less time occurs between transactions and that IW1 is still in the LWB when IR2 is received. In this case, TR2 (corresponding to IR2) is issued ahead of TW1 on the target interface since reads, due to their longer latency, have higher priority than writes. Therefore, the target transactions for row 2 are provided as TR2 (corresponding to IR2), TW1 (corresponding to IW1), and TW3 (corresponding to IW3). Note that the resulting order of the target transactions for rows 2 is different from row 1 due to the LWB allowing the target read to be taken out of order.

Referring to rows 3, 4, and 5, initiator transactions received from the initiator interface are IW1, IR2, and IW1, in that order. That is, the first and the second initiator write transactions are to the same address location 1. In row 3, it is assumed that there are sufficient time gaps between each transaction, similar to row 1 above, which results in a normal (and unique) one-to-one mapping between initiator and target transactions such that the resulting target transactions are TW1, TR2, and TW1, in that order. In row 4, it is assumed that IW1 is in the LWB when IR2 is received. Similar to row 2 above, TR2 is issued ahead of TW1 on the target interface as reads have a higher priority than writes. In row 4, it is also assumed that IW1 is out of the LWB at the time the second IW1 is received, meaning that the first TW1 is issued to the target interface prior to the second TW1, and each of the first and second TW1 is issued separately to the target interface. In row 5, it is also assumed that IW1 was in the LWB when IR2 was received, and thus TR2 is issued prior to TW1. However, in row 5, it is also assumed that the first IW1 is still in the LWB when the second IW1 is received. In this case, the first and second initiator writes to the same address are merged into a single write in the LWB and thus issued as a single target write TW1. Therefore, although three transactions were received from the initiator interface, only two transactions are provided on the target interface, TR2 followed by TW1, due to the merging in the LWB. Hence, due to the LWB, there is not a one-to-one mapping of initiator and target transactions.

Referring to rows 6, 7, and 8, initiator transactions received from the initiator interface are IW1, IR1, and IW1, in that order. All three transactions are to the same address location 1. In row 6, it is assumed that there are sufficient time gaps between each transaction, similar to rows 1 and 3 above, which results in a normal (and unique) one-to-one mapping between initiator and target transactions such that the resulting target transactions are TW1, TR1, and TW1, in that order. In row 7, it is assumed that the first IW1 is in the LWB when IR1 is received, resulting in an initiator read address hit in the LWB (a hit of address location 1). In this case, the data for the IR1 transaction is returned in response to IR1 directly from the LWB. That is, IR1 is serviced from the LWB, thus no TR1 is issued to the target interface for IR1 since it is not needed. In row 7, it is also assumed that a sufficient time gap exists between the first IW1 and the second IW1, that transactions TW1 (corresponding to the first IW1) and TW1 (corresponding to the second IW1) are issued separately. Therefore, the resulting target transactions are TW1 followed by TW1. In row 8, it is again assumed that IW1 is present in the LWB causing IR1 to hit in the LWB. IR1 is again serviced directly from the LWB, resulting in no TR1 on the target interface. In row 8, though, it is also assumed that the first IW1 is still in the LWB when the second IW1 is received. Since both initiator writes are to the same address location, they are merged in the LWB such that only a single target write TW1 is provided to the target interface. Note that in this case, only one target transaction results from the 3 received initiator transactions. Therefore, due to the LWB, in rows 7 and 8 there is not a one-to-one mapping of initiator and target transactions.

In the above table, only rows 1, 3, and 6 results in a normal and unique one-to-one mapping between initiator targets. In the other rows, target transactions are either reordered as compared to initiator transactions or reduced in number from the initiator transactions, or combinations thereof. For example, in rows 2, 4, and 6, there is a one-to-one mapping of transactions, but the transactions are reordered. In rows 5, 7, and 8, though, there is not a one-to-one mapping of initiator to target transactions due to the use of the LWB. Note that the above table only indicates some examples of initiator transactions with corresponding possible target transactions. That is, the table is not an exhaustive list of all situations in which a LWB can result in different possible target transactions.

In cases of a bridge which has no LWB, it is simple to verify data sanity, as initiator transactions can always be mapped one-to-one to target transactions. In currently known verification solutions for a bridge without a LWB, a simple verification scheme can use first-in first-out storage structures (FIFOs) to store initiator and target transactions and check their entries in order. However, this scheme does not work with a LWB, as illustrated in the table above in which the LWB causes many situations in which there is not a one-to-one mapping between initiator and target transactions. The LWB therefore adds to verification scenarios that need to be verified in order to fully verify data sanity of a bridge with a LWB.

Figure 1:
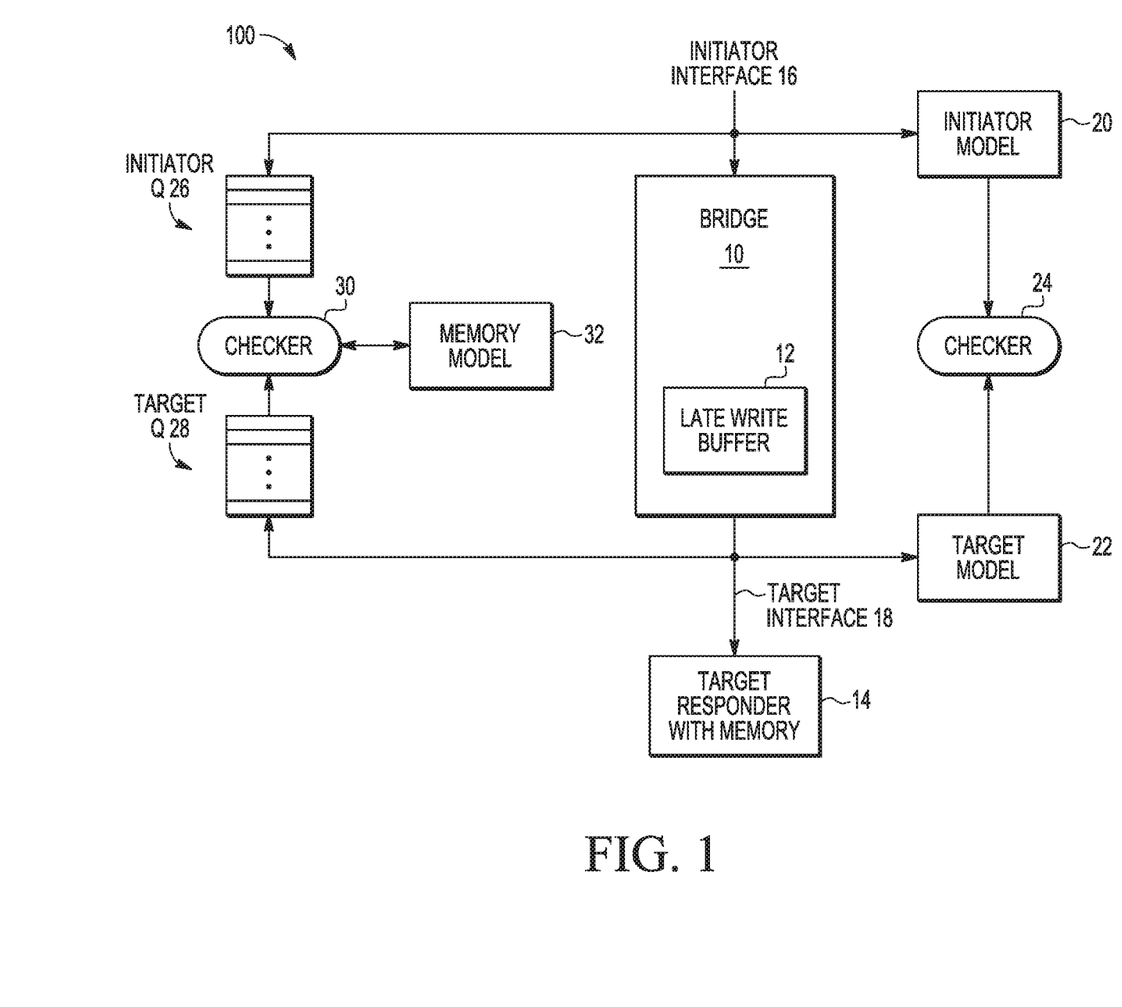
FIG. 1 illustrates, in block diagram form, a verification system for a bridge having a late write buffer, in accordance with one embodiment of the present invention.

FIG. 1 illustrates a verification system 100 which includes a bridge 10 as a device under test (DUT) having a late write buffer (LWB) 12. In order to provide verification of bridge 10, verification system 100 also includes a target responder with memory 14, an initiator model 20, a target model 22, a checker 24 in communication with the initiator and target models, an initiator queue 26 (also referred to as an initiator Q), a target queue 28 (also referred to as a target Q), a checker 30 in communication with the initiator and target Qs, and a memory model 32 in communication with checker 30. Initiator interface 16 provides transactions to bridge 10 and also communicates with initiator Q 26 and initiator model 20. Target interface 18 receives target transactions from bridge 10, corresponding to translated initiator transactions, and provides such target transactions to target responder with memory 14. In the illustrated embodiment, the target is assumed to have a memory, but can be any type of target. In one embodiment, bridge 10 is a model of a bridge having LWB 12. This model is therefore verified by verification system 100 before manufacturing of an integrated circuit having the bridge design. Once the model is verified, mask files can be generated, and the mask files used to manufacture an integrated circuit having a bridge with LWB corresponding to verified bridge 10.

Target responder with memory 14 is also a model used to verify bridge 10. Initiator model 20 is a model of bridge 10 in combination with the memory of target responder 14. That is, the entire bridge 10 with target responder 14 is considered as a memory on initiator interface 16. Target model 22 is a model of just the memory of target responder 14. Target responder 14 (i.e. the memory of target responder 14) is initialized with a pre-defined default value, such as all 0's.

On the initiator side, read transactions are checked using initiator model 20 which compares read data from a read transaction returned by bridge 10 to read data stored in initiator model 20. Initiator model 20 is updated with write data observed on writes to initiator interface 16. Upon an initiator read transaction on initiator interface 16, if the address exists in model 20 then the observed read data from bridge 10 is compared with the modelled data in model 20. If the read address does not exist in model 20, indicating that this is the first read to that address, the observed read data from bridge 10 is checked with the default target responder memory value (0, in one embodiment) and model 20 is also updated with the observed read data. This type of modelling with initiator model 20 helps with checking end-to-end data correctness on initiator interface 16, irrespective of the sequence and combination of target transactions. Since checking is done only on read transactions, the write transaction data sanity is maintained as long as a read follows a write at the same address. However, this means write data sanity is not checked if a write is not followed by a read at the same address. Also, this type of modelling does not cover the case in which an unexpected write occurs by bridge 10 on target interface 18 to an address not observed on initiator interface 16. Therefore, target model 22 and checker 24 are used for further checking.

Target model 22 models the memory of target responder 14 on target interface 18. Therefore, the data of target model 22 is updated with reads and write observed on target interface 18 rather than initiator interface 16. At the end of a verification test including a series of test transactions, both the initiator model 20 and target model 22 are checked for address and data entries by checker 24. This check makes sure that all effective initiator transactions on initiator interface 16 have also been observed on target interface 18, and that no unexpected transaction is observed on target interface 18. An unexpected transaction observed on target interface 18 would result in target model 22 not matching initiator model 20.

However, since this checking of target model 22 against initiator model 20 is done at the end of the verification test having a plurality or series of transactions, an error which occurs before the last write to a specific address is masked. For example, if it is assumed that three write transactions were issued to the same address but bridge 100 did not correctly generate a target write for the second (middle) transaction, the third write transaction to the same address will mask the error in the second write since the check is done after the data is updated on the third (last) write transaction. Therefore, simply using initiator model 20 and target model 22, as described in the previous paragraphs, is not sufficient to check the data sanity between transactions of a verification test. In this case, transaction level checking utilizing initiator queue 26, target queue 28, checker 30, and transactional level memory model 32 is also used to verify the data sanity for bridge 10 for write transactions.

Note that in conventional transaction level checking in use today, queues are used to store transactions observed on each of the initiator and target interfaces, and then matches of each entry of queues is determined sequentially. However, in a bridge with a LWB, such as bridge 10, this is not sufficient. For example, as described in reference to the table above, the initiator interface transaction may or may not be mapped to unique transactions on the target interface side depending on a hit or miss in the LWB. Therefore, in one embodiment, initiator Q 26 and target Q 28 are used, in combination with transactional level memory model 32, in which transactions are not simply checked one to one. This provides a more complete data sanity check.

Figure 2:
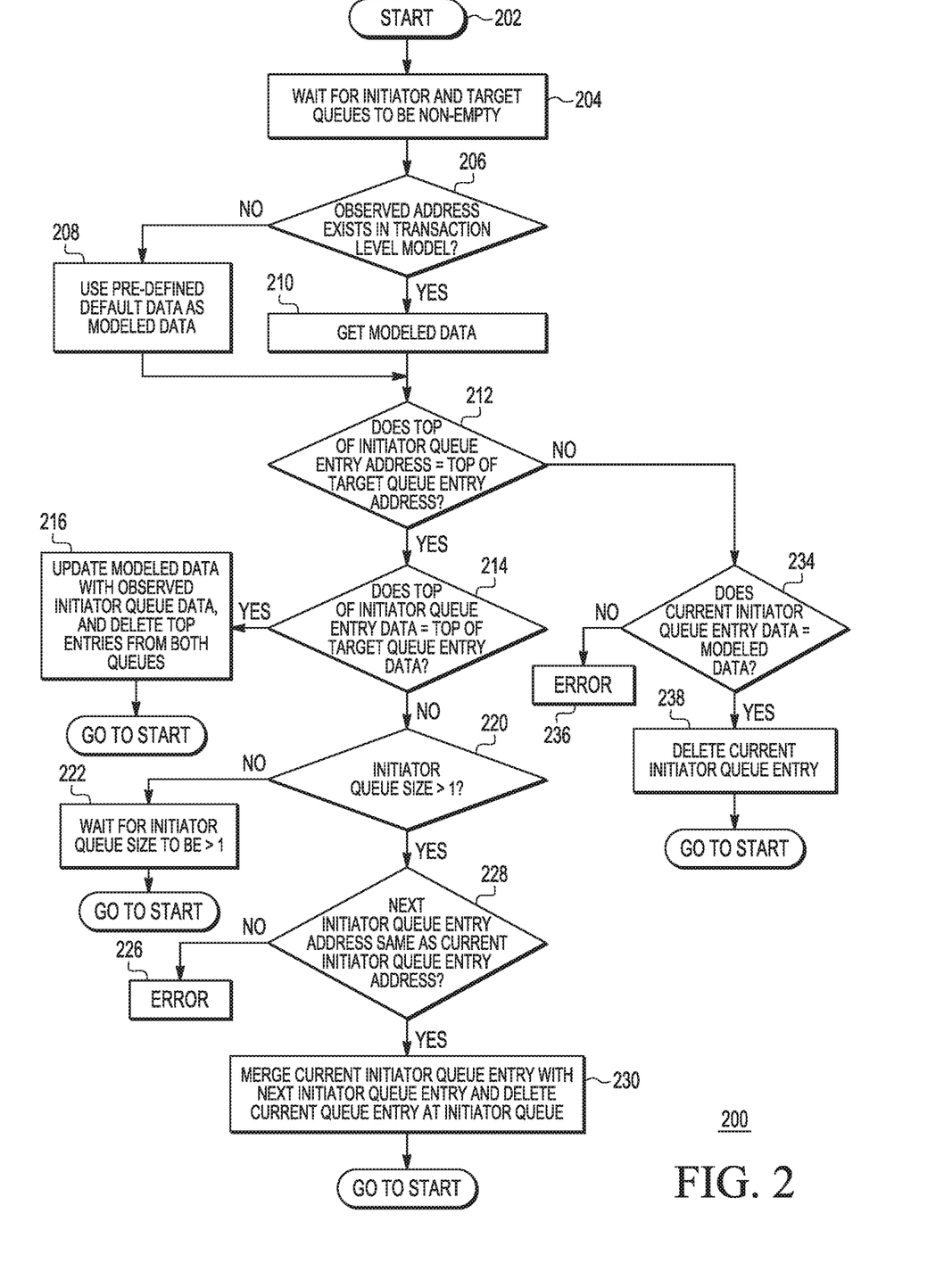
FIG. 2 illustrates, in flow diagram form, a method of verifying a bridge having a late write buffer using the verification system of FIG. 1, in accordance with one embodiment of the present invention.

Transactional level memory model 32 is modelled based on transactions observed on initiator interface 16. It is then updated with data observed on initiator interface 16 if data is matched on target interface 18 or the observed initiator transactions can be treated as merged in the LWB. Also, each of target queue 28 and initiator queue 26 operate as first-in first-out (FIFO) storage structures, in which transactions generally enter and exit each queue in a first-in first-out manner. Therefore, the top entry or head entry of a queue is generally the oldest entry of the queue, and the bottom entry or tail entry of the queue is generally the newest entry of the queue. FIG. 2 illustrates, in flow diagram form, a verification method 200 utilizing initiator queue 26, target queue 28, and transactional level memory model 32, performed by checker 30, which implements three main cases in order to improve verification of bridge 10. Verification method 200 will be described in reference to verification system 100 of FIG. 1. Also, verification method 200 is performed for write transactions to bridge 10. Note that transactional level memory model 32 is dynamic in that this model of the target memory is updated at each transaction.

Verification method 200 starts at block 202 and proceeds to block 204 in which method 200 waits for both initiator Q 26 and target Q 28 to be non-empty. When initiator Q 26 has received a transaction from initiator interface 16 and target Q 28 has received a transaction from target interface 18, method 200 proceeds to decision diamond 206 in which it is determined if the observed address in the top entry (e.g. the head entry) of initiator Q 26 exists in the transaction level memory model 32. Note that each transaction stored in either the initiator Q 26 or target Q 28 includes an entry address and corresponding entry data (which may be write data for the write transaction). If the observed address exists in memory model 32, method 200 proceeds to block 210 in which the modeled data is retrieved from the address location of memory model 32. If the observed address does not exist in memory model 32, method 200 proceeds to block 208 in which a pre-defined default data is used as the modeled data. For example, the pre-defined default data may be all 0's.

After obtaining the modeled data, whether in block 210 or 208, method 200 proceeds to decision diamond 212 in which it is determined if the entry address of the top of initiator queue 26 equals the entry address of the top of target queue 28. If so, it is determined, at decision diamond 214, if the entry data of the top of initiator queue 26 equals the entry data of the top of the target queue 28. If so, method 200 proceeds to block 216 in which the modeled data in memory model 32 is updated with the observed initiator queue data (in the top entry of initiator Q 26), and the top entries of the both the initiator and target queues are deleted. Method 200 then returns to start 202.

The path through decision diamond 212, decision diamond 214, and ending at block 216 implements a first main case for verification in which there is a one-to-one mapping of initiator and target transactions. This is the case, for example, when no merging of write transactions occurs in LWB or no reads from LWB occur.

Referring back to decision diamond 214, if the entry addresses at the tops of initiator Q 26 and target Q 28 match but the entry data at the tops of the initiator and target Qs do not match, method 200 proceeds to decision diamond 220 in which it is determined if the size (i.e. number of entries) of initiator Q 26 is greater than one. If not, method 200 proceeds to block 222 in which method 200 waits for the size of initiator Q 26 to be greater than one and then returns to start 202. If, however, the size of initiator Q 26 is greater than one, method 200 proceeds from decision diamond 220 to decision diamond 228.

At decision diamond 228, it is determined if the entry address of the next entry of initiator Q 26 is the same as the entry address for the current entry of initiator Q 26 (corresponding to the top entry of the initiator Q). If so, at block 230, the current initiator Q entry is merged with the next initiator Q entry, and the current queue entry of the initiator Q is deleted. Method 200 then proceeds back to start 202.

The path through decision diamonds 212, 214, 220, and 228 to block 230 implements a second main case in which the LWB is used to merge two or more initiator write transactions to form a single write transaction (examples of which were described with respect to lines 5 and 8 in the table above in which the LWB causes there to not be a one-to-one mapping of transactions), This second main case can occur when two initiator write transactions at the same address have different data. This can be as a result of different data for two transactions with a full width write or as a result of two partial write transactions which have different byte strobes. (As used herein, a "0b" preceding a number indicates it is in binary format, and a "0x" preceding a number indicates it is in hexadecimal format.) For example, in the case of partial writes, a first initiator partial write IW1 with data 0x1111 and byte strobe 0b01 (assuming a two byte data width, in which this strobe represents the first byte of the partial write) can occur followed by a second initiator partial write IW1 with data 0x2222 and byte strobe 0b10 (which represents the second byte of the partial write), Merging these two initiator partial write transactions will result in a single target write transaction TW1 with data 0x2211 on the target interface and thus in the target Q. Therefore, the initiator Q will have first and second IW1 transactions, and neither of these transactions will individually match to a target Q entry. They will match only when merged, Therefore, verification method 200 is able to accurately verify this second case in which there is not a one-to-one matching due to merging in the LWB.

Referring back to FIG. 2, if, at decision diamond 228, there is more than one entry in initiator Q 26 but the entry addresses of the next entry and current entry do not match, an error is indicated at block 226. In this case, an error occurs because the data entry of the top entries of initiator Q 26 and target Q 28 do not match and yet, there are not multiple initiator Q entries which can be merged. This indicates that an error has occurred with the operation of bridge 10 and LWB 12.

Referring back to decision diamond 212, if the entry address at the top of initiator Q 26 does not match the entry address at the top of target Q 28, method 200 proceeds to decision diamond 234 in which it is determined if the entry data of the current initiator Q entry (currently the top entry) matches the modeled data. If not, an error is indicated at block 236. However, if they do match, the current initiator Q entry is deleted at bock 238, and method 200 returns to start 202.

The path through decision diamonds 212 to 234 to 238 implements a third main case in which there is not one-to-one matching due to merging in the LWB. For example, if partial write transactions having the same data and byte strobes (IW1 and IW1) are merged, the first initiator Q entry will match the first target Q entry and both will be deleted, leaving a stale entry (the second IW1) as the second transaction in the initiator Q which does not match an entry in the target Q, Assuming a third initiator write transaction IW2 at a different address (address 2) than the address of the first two partial writes (address 1), the top entry address 1 of the initiator Q (corresponding to the second IW1) will not match the top entry address 2 of the target Q (corresponding to TW2). However, data in the top entry of the initiator Q (corresponding to the second IW1) would be the same as modeled data in memory model 32, and this stale entry can be considered valid and deleted from the initiator Q. Therefore, verification method 200 is also able to accurately verify this case.

By now it should be appreciated that a method has been provided to verify data sanity of a bridge with a LWB. In doing so, a combination of different memory models (e.g. initiator model 20, target model 22, and memory model 32) are implemented in order to provide a complete data sanity verification.

For example, a responder with memory (e.g. target responder 14) is connected to the target interface, in which the entire bridge and target responder is considered an abstract memory on the initiator interface (e.g. by the initiator model 20 on initiator interface 16). This memory model (e.g. initiator model 20) is updated with data observed on writes to the initiator interface. On initiator interface reads, if the address exists in the memory model, then the observed data on the initiator interface is compared to the modeled data, else the observed data is checked with default target responder memory value and the initiator memory model is updated. This type of modelling helps in checking end-to-end correctness on the initiator interface, irrespective of sequence and combination of transactions.

Also, for the verification, memory is modelled on both initiator and target interfaces (e.g. with initiator model 20 and target model 22), and at the end of the test, which includes a plurality of transactions, both models are checked for address and data entries. This ensures that all effective initiator transactions have been observed on the target interface, and that no unexpected transaction is observed on the target interface.

Lastly, for the verification, transaction level checking is also performed. The initiator interface may or may not be mapped to unique transactions on the target interface depending on a hit or miss in the LWB. Therefore, transactions stored on the initiator and target queues (e.g. initiator Q 26 and target Q 28) cannot be matched using conventional one to one transaction level checking. Verification method 200 therefore is implemented to map initiator transactions to the target transactions, such as for the cases in which use of the LWB do not result in uniquely mapped one to one initiator to target transactions. In this transaction level checking, initiator and target Qs are used to store transactions observed on both the initiator and target interfaces, in which verification method 200 co-relates transactions from these queues.

Therefore, by using the above approaches, data sanity of a bridge having a LWB may be verified. It can also be appreciated how conventional one-to-one transaction level verification fails to verify data sanity of a bridge in the cases in which a LWB is used. However, though the use of initiator and target Q's, as well as a memory model such as memory model 32, a verification system may correctly verify memory level transactions of a bridge, even with the use of an LWB in the bridge, thus providing improved data verification.

Figure 3:
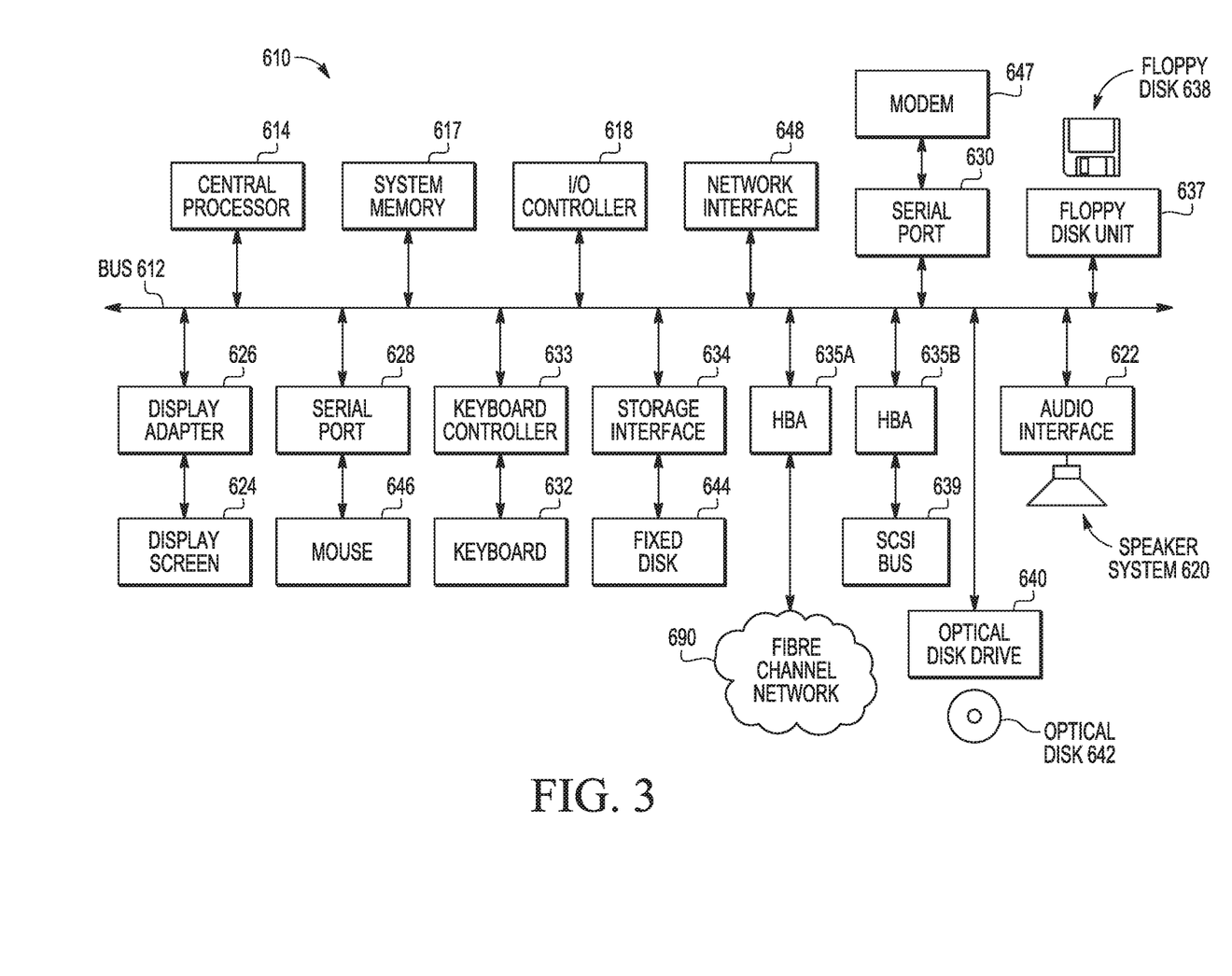
FIG. 3 illustrates, in block diagram form, a verification system in accordance with one embodiment of the present invention.

FIG. 3 depicts a block diagram of a verification system 610 suitable for implementing aspects of the present invention. Verification system 610 includes a bus 612 which interconnects major subsystems of verification system 610, such as a central processor 614, a system memory 617 (typically RAM, but which may also include ROM, flash RAM, or the like), an input/output controller 618, an external audio device, such as a speaker system 620 via an audio output interface 622, an external device, such as a display screen 624 via display adapter 626, serial ports 628 and 630, a keyboard 632 (interfaced with a keyboard controller 633), a storage interface 634, a floppy disk drive 637 operative to receive a floppy disk 638, a host bus adapter (HBA) interface card 635A operative to connect with a Fiber Channel network 690, a host bus adapter (HBA) interface card 635B operative to connect to a SCSI bus 639, and an optical disk drive 640 operative to receive an optical disk 642. Also included are a mouse 646 (or other point-and-click device, coupled to bus 612 via serial port 628), a modem 647 (coupled to bus 612 via serial port 630), and a network interface 648 (coupled directly to bus 612).

Bus 612 allows data communication between central processor 614 and system memory 617, which may include read-only memory (ROM) or flash memory, and random access memory (RAM), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with system 610 are generally stored on and accessed via a computer-readable medium, such as a hard disk drive (e.g., fixed disk 644), an optical drive (e.g., optical drive 640), a floppy disk unit 637, or other storage medium. Additionally, applications can be in the form of electronic signals modulated in accordance with the application and data communication technology when accessed via network modem 647 or network interface 648.

Storage interface 634, as with the other storage interfaces of system 610, can connect to a standard computer-readable medium for storage and/or retrieval of information, such as a fixed disk drive 644. Fixed disk drive 644 may be a part of system 610 or may be separate and accessed through other interface systems. Modem 647 may provide a direct connection to a remote server via a telephone link or to the Internet via an internet service provider (ISP). Network interface 648 may provide a direct connection to a remote server via a direct network link to the Internet via a POP (point of presence). Network interface 648 may provide such connection using wireless techniques, including digital cellular telephone connection, Cellular Digital Packet Data (CDPD) connection, digital satellite data connection or the like.

Many other devices or subsystems (not shown) may be connected in a similar manner (e.g., document scanners, digital cameras and so on). Conversely, all of the devices shown in FIG. 6 need not be present to practice the present invention. The devices and subsystems can be interconnected in different ways from that shown in FIG. 6. The operation of a computer system such as that shown in FIG. 6 is readily known in the art and is not discussed in detail in this application. Code and data to implement the verification system described above can be stored in computer-readable storage media such as one or more of system memory 617, fixed disk 644, optical disk 642, or floppy disk 638. The operating system provided on computer system 610 may be MS-DOS®, MS-WINDOWS®, OS/2®, UNIX®, Linux®, or another known operating system.

Figure 4:
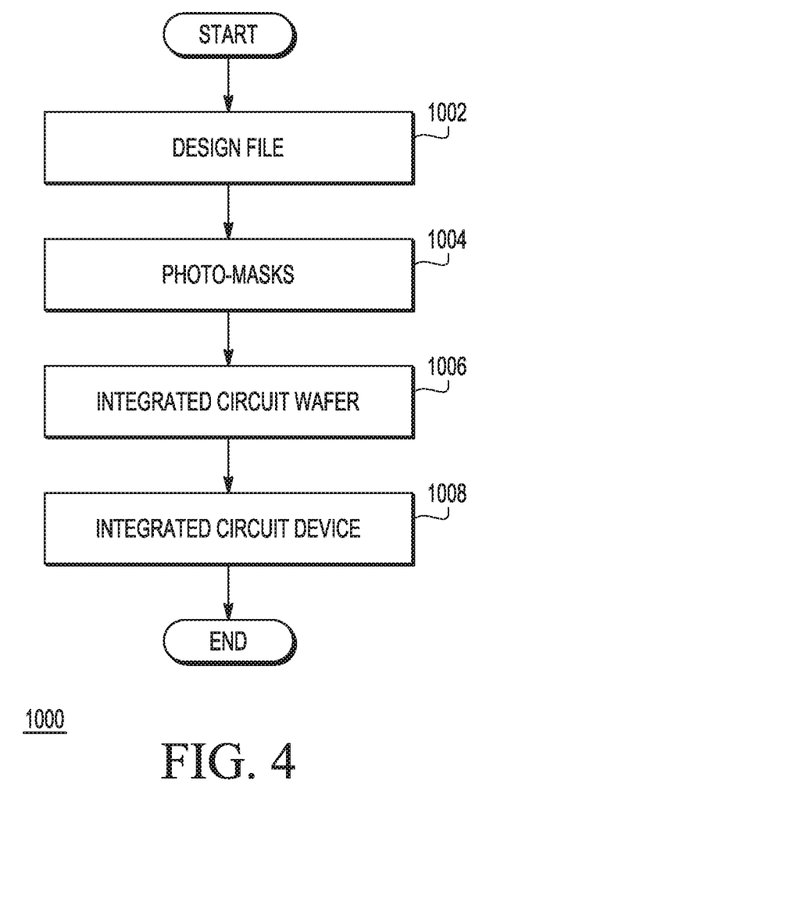
FIG. 4 illustrates, in flow diagram form, a method for manufacturing an integrated circuit device in accordance with one embodiment of the present invention.

FIG. 4 is a flow diagram illustrating a method 1000 in accordance with a specific embodiment of the present invention. At block 1002, information included in a design file is provided to a photo-lithography facility. For example, the design file may include a verified design of a bridge with a LWB, such has bridge 10, which has been verified using verification system 100 of FIG. 1. The method proceeds to block 1004 where photo-masks are manufactured and provided to an integrated circuit wafer-fabrication facility. The method proceeds to block 1006 where an integrated circuit wafer is fabricated using the photo-masks. The method proceeds to block 1008 where integrated circuit devices are manufactured from integrated circuit die included in the integrated circuit wafer.

Embodiments of the present invention are well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The foregoing describes embodiments including components contained within other components (e.g., the various elements shown as components of computer system 610). Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The foregoing detailed description has set forth various embodiments of the present invention via the use of block diagrams, flowcharts, and examples. It will be understood by those within the art that each block diagram component, flowchart step, operation and/or component illustrated by the use of examples can be implemented, individually and/or collectively, by a wide range of hardware, software, firmware, or any combination thereof.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The present invention has been described in the context of fully functional computer systems; however, those skilled in the art will appreciate that the present invention is capable of being distributed as a program product in a variety of forms, and that the present invention applies equally regardless of the particular type of computer-readable media used to actually carry out the distribution. Examples of computer-readable media include computer-readable storage media, as well as media storage and distribution systems developed in the future.

The above-discussed embodiments can be implemented by software modules that perform one or more tasks associated with the embodiments. The software modules discussed herein may include script, batch, or other executable files. The software modules may be stored on a machine-readable or computer-readable storage media such as magnetic floppy disks, hard disks, semiconductor memory (e.g., RAM, ROM, and flash-type media), optical discs (e.g., CD-ROMs, CD-Rs, and DVDs), or other types of memory modules. A storage device used for storing firmware or hardware modules in accordance with an embodiment of the invention can also include a semiconductor-based memory, which may be permanently, removably or remotely coupled to a microprocessor/memory system. Thus, the modules can be stored within a computer system memory to configure the computer system to perform the functions of the module. Other new and various types of computer-readable storage media may be used to store the modules discussed herein.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Consequently, the invention is intended to be limited only by the scope of the appended claims, giving full cognizance to equivalents in all respects.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a device under test (DUT) includes a bridge having a late write buffer, wherein the bridge is coupled between an initiator interface and a target interface, and wherein the target interface is coupled to a target memory. In this embodiment, a method of verifying the DUT includes storing write requests provided to the bridge on the initiator interface in entries of an initiator queue and storing write requests provided to the target memory on the target interface in entries of a target queue, wherein each entry of the initiator queue and target queue includes an entry address and corresponding entry data to be written at the entry address. Upon both the initiator and target queues being non-empty: when an entry address of a top entry of the initiator queue matches an entry address of a top entry of the target queue, a data entry of the top entry of the initiator queue does not match a data entry of the trop entry of the target queue, and the initiator queue has more than one entry, determining whether an entry address of a next entry in the initiator queue matches the entry address of the top entry in the initiator queue: when the entry address of the next entry in the initiator queue matches the entry address of the top entry in the initiator queue, merging the top entry of the initiator queue with the next entry in the initiator queue and deleting the top entry of the initiator queue; and when the entry address of the next entry in the initiator queue does not match the entry address of the top entry in the initiator queue, indicating an error in the DUT. In one aspect of this one embodiment, upon both the initiator and target queues being non-empty, obtaining modeled data corresponding to an observed address, wherein the observed address corresponds to the entry address in the top entry of the initiator queue. In a further aspect, obtaining modeled data corresponding to the address stored in the top entry of the initiator queue comprises determining whether the observed address exists in a transactional level memory model which models the target memory. In yet a further aspect, the method further includes, when the observed address exists in the transactional level memory model, accessing the transactional level memory model to obtain the modeled data stored at the address. In yet a further aspect, the method further includes, when the observed address does not exist in the transactional level memory model, using a pre-defined default data value as the modeled data. In another aspect, the method further includes, upon both the initiator and target queues being non-empty, when an entry address of a top entry of the initiator queue matches an entry address of a top entry of the target queue and a data entry of the top entry of the initiator queue matches a data entry of the trop entry of the target queue, storing the entry data of the top entry of the initiator queue into the transactional level memory model at the observed address and deleting the top entries of initiator and target queues. In another aspect of the one embodiment, the method further includes, upon both the initiator and target queues being non-empty, when the entry address of the next entry in the initiator queue does not match the entry address of the top entry in the initiator queue, indicating a verification error. In another aspect, the method further includes, upon both the initiator and target queues being non-empty, when the entry address of the top entry of the initiator queue does not match an entry address of a top entry of the target queue and the entry data of the top entry of the initiator queue matches the modeled data, deleting the top entry of the initiator queue. In a further aspect, the method further includes, upon both the initiator and target queues being non-empty, when the entry address of the top entry of the initiator queue does not match an entry address of a top entry of the target queue and the entry data of the top entry of the initiator queue does not match the modeled data, indicating a verification error. In yet another aspect, the method further includes, coupling an initiator model to the initiator interface which models the bridge and target responder together as a memory; updating the initiator model with write data observed on write requests which are provided to the bridge via the initiator interface; and in response to a read transaction provided to the bridge via the initiator interface, determining whether read data from the read transaction matches data stored in the initiator model at a corresponding read address of the read transaction. In a further aspect, the method further includes coupling a target model to the target interface which models the target responder; after a providing a plurality of transactions to the bridge via the initiator interface and the bridge processing the plurality of transactions, checking address and data entries of the target model against the initiator model. In yet another aspect, the method further includes after verification of the DUT, generating a design file for the verified DUT; and forming an integrated circuit device in accordance with the design file.

In another embodiment, a method for verifying a device under test (DUT) in which the DUT includes a bridge having a late write buffer, wherein the bridge is coupled between an initiator interface and a target interface, and wherein the target interface is coupled to a target memory, includes storing write requests provided to the bridge on the initiator interface in entries of an initiator queue; storing write requests provided to the target memory on the target interface in entries of a target queue, wherein each entry of the initiator queue and target queue includes an entry address and corresponding entry data to be written at the entry address; upon both the initiator and target queues being non-empty: obtaining modeled data corresponding to an observed address, wherein the observed address corresponds to the entry address in the top entry of the initiator queue; when the entry address of the top entry of the initiator queue does not match an entry address of a top entry of the target queue and the entry data of the top entry of the initiator queue matches the modeled data, deleting the top entry of the initiator queue; and when the entry address of the top entry of the initiator queue does not match an entry address of a top entry of the target queue and the entry data of the top entry of the initiator queue does not match the modeled data, indicating an error in the DUT. In one aspect of the another embodiment, obtaining modeled data corresponding to the address stored in the top entry of the initiator queue includes determining whether the observed address exists in a transactional level memory model which models the target memory. In a further aspect, the method further includes, when the observed address exists in the transactional level memory model, accessing the transactional level memory model to obtain the modeled data stored at the address. In yet a further aspect, the method further includes, when the observed address does not exist in the transactional level memory model, using a pre-defined default data value as the modeled data. In another aspect of the another embodiment, the method further includes, after verification of the DUT, generating a design file for the verified DUT; and forming an integrated circuit device in accordance with the design file.

In yet another embodiment, a verification system for verifying a device under test (DUT) in which the DUT includes a bridge having a late write buffer and wherein the bridge is coupled between an initiator interface and a target interface, includes a target responder with memory coupled to the target interface which receives transactions processed by the bridge; an initiator queue coupled to the initiator interface configured to store write transactions on the initiator interface; a target queue coupled to the target interface configured to store write transactions on the target interface, wherein use of the late write buffer in the bridge to process transactions prevents a one to one transaction level matching of transactions in the initiator queue to transactions of the target queue; a transactional level memory model which models the target responder with memory; and a checker coupled to the initiator queue, target queue; and transactional memory model, wherein the checker is configured to use the transactional level memory model to verify mapping of transactions stored in the target queue with transactions stored in the initiator queue when they do not uniquely map one to one with each other. In one aspect of the yet another embodiment, the verification system further includes an initiator model coupled to the initiator interface which models the bridge and target responder together as a memory in which the initiator model is configured to be updated with write data observed on write requests which are provided to the bridge via the initiator interface, and in response to a read transaction provided to the bridge via the initiator interface, determining whether read data from the read transaction matches data stored in the initiator model at a corresponding read address of the read transaction. In a further aspect, the verification system further includes a target model coupled to the target interface which models the target responder, wherein a checker is configured to, after a plurality of transactions are provided to the bridge via the initiator interface and processed by the bridge, check address and data entries of the target model against the initiator model.

What is claimed is:

1. A method for verifying a device under test (DUT) in which the DUT includes a bridge having a late write buffer, wherein the bridge is coupled between an initiator interface and a target interface, wherein the target interface is coupled to a target memory, the method comprising:
   storing write requests provided to the bridge on the initiator interface in entries of an initiator queue;
   storing write requests provided to the target memory on the target interface in entries of a target queue, wherein each entry of the initiator queue and target queue includes an entry address and corresponding entry data to be written at the entry address;
   upon both the initiator and target queues being non-empty:
       when an entry address of a top entry of the initiator queue matches an entry address of a top entry of the target queue, a data entry of the top entry of the initiator queue does not match a data entry of the top entry of the target queue, and the initiator queue has more than one entry, determining whether an entry address of a next entry in the initiator queue matches the entry address of the top entry in the initiator queue;

when the entry address of the next entry in the initiator queue matches the entry address of the top entry in the initiator queue, merging the top entry of the initiator queue with the next entry in the initiator queue and deleting the top entry of the initiator queue; and when the entry address of the next entry in the initiator queue does not match the entry address of the top entry in the initiator queue, indicating an error in the DUT.

2. The method of claim 1, wherein, upon both the initiator and target queues being non-empty, obtaining modeled data corresponding to an observed address, wherein the observed address corresponds to the entry address in the top entry of the initiator queue.

3. The method of claim 2, wherein obtaining modeled data corresponding to the address stored in the top entry of the initiator queue comprises determining whether the observed address exists in a transactional level memory model which models the target memory.

4. The method of claim 3, further comprising, when the observed address exists in the transactional level memory model, accessing the transactional level memory model to obtain the modeled data stored at the address.

5. The method of claim 4, further comprising, when the observed address does not exist in the transactional level memory model, using a pre-defined default data value as the modeled data.

6. The method of claim 2, further comprising:
upon both the initiator and target queues being non-empty, when an entry address of a top entry of the initiator queue matches an entry address of a top entry of the target queue and a data entry of the top entry of the initiator queue matches a data entry of the top entry of the target queue, storing the entry data of the top entry of the initiator queue into the transactional level memory model at the observed address and deleting the top entries of initiator and target queues.

7. The method of claim 1, further comprising:
upon both the initiator and target queues being non-empty, when the entry address of the next entry in the initiator queue does not match the entry address of the top entry in the initiator queue, indicating a verification error.

8. The method of claim 2, further comprising:
upon both the initiator and target queues being non-empty, when the entry address of the top entry of the initiator queue does not match an entry address of a top entry of the target queue and the entry data of the top entry of the initiator queue matches the modeled data, deleting the top entry of the initiator queue.

9. The method of claim 8, further comprising:
upon both the initiator and target queues being non-empty, when the entry address of the top entry of the initiator queue does not match an entry address of a top entry of the target queue and the entry data of the top entry of the initiator queue does not match the modeled data, indicating a verification error.

10. The method of claim 1, further comprising:
coupling an initiator model to the initiator interface which models the bridge and target memory together as a memory;
updating the initiator model with write data observed on write requests which are provided to the bridge via the initiator interface; and
in response to a read transaction provided to the bridge via the initiator interface, determining whether read data from the read transaction matches data stored in the initiator model at a corresponding read address of the read transaction.

11. The method of claim 10, further comprising:
coupling a target model to the target interface which models the target responder;
after providing a plurality of transactions to the bridge via the initiator interface and the bridge processing the plurality of transactions, checking address and data entries of the target model against the initiator model.

12. The method of claim 1, further comprising:
after verification of the DUT, generating a design file for the verified DUT; and
forming an integrated circuit device in accordance with the design file.

13. A method for verifying a device under test (DUT) in which the DUT includes a bridge having a late write buffer, wherein the bridge is coupled between an initiator interface and a target interface, wherein the target interface is coupled to a target memory, the method comprising:
storing write requests provided to the bridge on the initiator interface in entries of an initiator queue;
storing write requests provided to the target memory on the target interface in entries of a target queue, wherein each entry of the initiator queue and target queue includes an entry address and corresponding entry data to be written at the entry address;
upon both the initiator and target queues being non-empty:
obtaining modeled data corresponding to an observed address, wherein the observed address corresponds to the entry address in the top entry of the initiator queue;
when the entry address of the top entry of the initiator queue does not match an entry address of a top entry of the target queue and the entry data of the top entry of the initiator queue matches the modeled data, deleting the top entry of the initiator queue; and
when the entry address of the top entry of the initiator queue does not match an entry address of a top entry of the target queue and the entry data of the top entry of the initiator queue does not match the modeled data, indicating an error in the DUT.

14. The method of claim 13, wherein obtaining modeled data corresponding to the address stored in the top entry of the initiator queue comprises determining whether the observed address exists in a transactional level memory model which models the target memory.

15. The method of claim 14, further comprising, when the observed address exists in the transactional level memory model, accessing the transactional level memory model to obtain the modeled data stored at the address.

16. The method of claim 15, further comprising, when the observed address does not exist in the transactional level memory model, using a pre-defined default data value as the modeled data.

17. The method of claim 13, further comprising:
after verification of the DUT, generating a design file for the verified DUT; and
forming an integrated circuit device in accordance with the design file.

18. A verification system for verifying a device under test (DUT) in which the DUT includes a bridge having a late write buffer, wherein the bridge is coupled between an initiator interface and a target interface, comprising:
a target responder having a memory, wherein the target responder is coupled to the target interface which receives transactions processed by the bridge;
an initiator queue coupled to the initiator interface configured to store write transactions on the initiator interface;
a target queue coupled to the target interface configured to store write transactions on the target interface, wherein use of the late write buffer in the bridge to process transactions prevents a one to one transaction level matching of transactions in the initiator queue to transactions of the target queue;
a transactional level memory model which models the target responder; and
a checker coupled to the initiator queue, target queue, and transactional memory model, wherein the checker is configured to use the transactional level memory model to verify mapping of transactions stored in the target queue with transactions stored in the initiator queue when the transactions do not uniquely map one to one with each other.

19. The verification system of claim 18, further comprising:
an initiator model coupled to the initiator interface which models the bridge and target responder together as a memory in which the initiator model is configured to be updated with write data observed on write requests provided to the bridge via the initiator interface, and in response to a read transaction provided to the bridge via the initiator interface, determining whether read data from the read transaction matches data stored in the initiator model at a corresponding read address of the read transaction.

20. The verification system of claim 19, further comprising:
a target model coupled to the target interface which models the target responder, wherein a second checker is configured to, after a plurality of transactions are provided to the bridge via the initiator interface and processed by the bridge, check address and data entries of the target model against the initiator model.

* * * * *